United States Patent
Chen et al.

(10) Patent No.: US 10,554,225 B2
(45) Date of Patent: *Feb. 4, 2020

(54) DATA STORAGE DEVICE ENCODING AND INTERLEAVING CODEWORDS TO IMPROVE TRELLIS SEQUENCE DETECTION

(71) Applicant: Western Digital Technologies, Inc., San Jose, CA (US)

(72) Inventors: Yiming Chen, Rancho Santa Margarita, CA (US); Anantha Raman Krishnan, Foothill Ranch, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/105,689

(22) Filed: Aug. 20, 2018

(65) Prior Publication Data

US 2019/0081642 A1 Mar. 14, 2019

Related U.S. Application Data

(63) Continuation of application No. 15/157,289, filed on May 17, 2016, now Pat. No. 10,056,920, which is a (Continued)

(51) Int. Cl.
*H03M 13/00* (2006.01)
*H03M 13/29* (2006.01)
(Continued)

(52) U.S. Cl.
CPC ..... *H03M 13/2906* (2013.01); *G11B 5/59616* (2013.01); *H03M 13/1102* (2013.01); *H03M 13/13* (2013.01); *H03M 13/256* (2013.01); *H03M 13/27* (2013.01); *H03M 13/2742* (2013.01); *H03M 13/2757* (2013.01); *H03M 13/2792* (2013.01); *H03M 13/2957* (2013.01);
(Continued)

(58) Field of Classification Search
None
See application file for complete search history.

(56) References Cited

U.S. PATENT DOCUMENTS

| | | |
|---|---|---|
| 5,898,710 A | 4/1999 | Amrany |
| 6,018,789 A | 1/2000 | Sokolov et al. |

(Continued)

OTHER PUBLICATIONS

A. Dholakia, E. Eleftheriou, T. Mittelholzer and M. P. C. Fossorier, "Capacity-approaching codes: can they be applied to the magnetic recording channel?," in IEEE Communications Magazine, vol. 42, No. 2, pp. 122-130, Feb. 2004. (Year: 2004).*

*Primary Examiner* — Daniel F. McMahon
(74) *Attorney, Agent, or Firm* — Knobbe Martens Olson & Bear LLP

(57) ABSTRACT

A data storage device is disclosed comprising a storage medium. Input data is encoded according to at least one channel code constraint to generate first data and second data. The first data is encoded into a first codeword, and the second data is encoded into a second codeword, wherein a first code rate of the first codeword is less than a second code rate of the second codeword. The first codeword and the second codeword are interleaved to generate an interleaved codeword, and the interleaved codeword is written to the storage medium.

20 Claims, 7 Drawing Sheets

Related U.S. Application Data continuation-in-part of application No. 14/930,898, filed on Nov. 3, 2015, now Pat. No. 9,761,273.

(51) Int. Cl.

| | | |
|---|---|---|
| *H03M 13/27* | (2006.01) | |
| *H03M 13/41* | (2006.01) | |
| *H03M 13/25* | (2006.01) | |
| *H03M 13/11* | (2006.01) | |
| *G11B 5/596* | (2006.01) | |
| *H03M 13/35* | (2006.01) | |
| *H03M 13/13* | (2006.01) | |
| *H03M 13/31* | (2006.01) | |
| *G11B 20/18* | (2006.01) | |

(52) U.S. Cl.
CPC ......... *H03M 13/31* (2013.01); *H03M 13/356* (2013.01); *H03M 13/4138* (2013.01); *H03M 13/6325* (2013.01); *H03M 13/6513* (2013.01); *H03M 13/6516* (2013.01); *G11B 2020/1863* (2013.01)

(56) References Cited

U.S. PATENT DOCUMENTS

| | | |
|---|---|---|
| 6,065,095 A | 5/2000 | Sokolov et al. |
| 6,078,452 A | 6/2000 | Kittilson et al. |
| 6,081,447 A | 6/2000 | Lofgren et al. |
| 6,092,149 A | 7/2000 | Hicken et al. |
| 6,092,150 A | 7/2000 | Sokolov et al. |
| 6,094,707 A | 7/2000 | Sokolov et al. |
| 6,105,104 A | 8/2000 | Guttman et al. |
| 6,111,717 A | 8/2000 | Cloke et al. |
| 6,145,052 A | 11/2000 | Howe et al. |
| 6,175,893 B1 | 1/2001 | D'Souza et al. |
| 6,178,056 B1 | 1/2001 | Cloke et al. |
| 6,185,173 B1 | 2/2001 | Livingston et al. |
| 6,191,909 B1 | 2/2001 | Cloke et al. |
| 6,195,218 B1 | 2/2001 | Guttmann et al. |
| 6,205,494 B1 | 3/2001 | Williams |
| 6,208,477 B1 | 3/2001 | Cloke et al. |
| 6,223,303 B1 | 4/2001 | Billings et al. |
| 6,230,233 B1 | 5/2001 | Lofgren et al. |
| 6,246,346 B1 | 6/2001 | Cloke et al. |
| 6,249,393 B1 | 6/2001 | Billings et al. |
| 6,256,695 B1 | 7/2001 | Williams |
| 6,262,857 B1 | 7/2001 | Hull et al. |
| 6,263,459 B1 | 7/2001 | Schibilla |
| 6,289,484 B1 | 7/2001 | Rothberg et al. |
| 6,272,694 B1 | 8/2001 | Weaver et al. |
| 6,278,568 B1 | 8/2001 | Cloke et al. |
| 6,279,089 B1 | 8/2001 | Schibilla et al. |
| 6,292,912 B1 | 9/2001 | Cloke et al. |
| 6,310,740 B1 | 10/2001 | Dunbar |
| 6,317,850 B1 | 11/2001 | Rothberg |
| 6,327,106 B1 | 12/2001 | Rothberg |
| 6,337,778 B1 | 1/2002 | Gagne |
| 6,369,969 B1 | 4/2002 | Christiansen et al. |
| 6,384,999 B1 | 5/2002 | Schibilla |
| 6,388,833 B1 | 5/2002 | Golowka et al. |
| 6,405,342 B1 | 6/2002 | Lee |
| 6,408,357 B1 | 6/2002 | Hanmann et al. |
| 6,408,406 B1 | 6/2002 | Parris |
| 6,411,452 B1 | 6/2002 | Cloke |
| 6,411,458 B1 | 6/2002 | Billings et al. |
| 6,412,083 B1 | 6/2002 | Rothberg et al. |
| 6,415,349 B1 | 7/2002 | Hull et al. |
| 6,425,128 B1 | 7/2002 | Krapf et al. |
| 6,441,981 B1 | 8/2002 | Cloke et al. |
| 6,442,328 B1 | 8/2002 | Elliott et al. |
| 6,445,524 B1 | 9/2002 | Nazarian et al. |
| 6,449,767 B1 | 9/2002 | Krapf et al. |
| 6,453,115 B1 | 9/2002 | Boyle |
| 6,470,420 B1 | 10/2002 | Hospedor |
| 6,480,020 B1 | 11/2002 | Jung et al. |
| 6,480,349 B1 | 11/2002 | Kim et al. |
| 6,480,932 B1 | 11/2002 | Vallis et al. |
| 6,483,986 B1 | 11/2002 | Krapf |
| 6,487,032 B1 | 11/2002 | Cloke et al. |
| 6,490,635 B1 | 12/2002 | Holmes |
| 6,493,173 B1 | 12/2002 | Kim et al. |
| 6,499,083 B1 | 12/2002 | Hamlin |
| 6,499,128 B1 | 12/2002 | Gerlach et al. |
| 6,519,104 B1 | 2/2003 | Cloke et al. |
| 6,525,892 B1 | 2/2003 | Dunbar et al. |
| 6,545,830 B1 | 4/2003 | Briggs et al. |
| 6,546,489 B1 | 4/2003 | Frank, Jr. et al. |
| 6,550,021 B1 | 4/2003 | Dalphy et al. |
| 6,552,880 B1 | 4/2003 | Dunbar et al. |
| 6,553,457 B1 | 4/2003 | Wilkins et al. |
| 6,578,106 B1 | 6/2003 | Price |
| 6,580,573 B1 | 6/2003 | Hull et al. |
| 6,594,183 B1 | 7/2003 | Lofgren et al. |
| 6,600,620 B1 | 7/2003 | Krounbi et al. |
| 6,601,137 B1 | 7/2003 | Castro et al. |
| 6,603,622 B1 | 8/2003 | Christiansen et al. |
| 6,603,625 B1 | 8/2003 | Hospodor et al. |
| 6,604,220 B1 | 8/2003 | Lee |
| 6,606,682 B1 | 8/2003 | Dang et al. |
| 6,606,714 B1 | 8/2003 | Thelin |
| 6,606,717 B1 | 8/2003 | Yu et al. |
| 6,611,393 B1 | 8/2003 | Nguyen et al. |
| 6,615,312 B1 | 9/2003 | Hamlin et al. |
| 6,639,748 B1 | 10/2003 | Christiansen et al. |
| 6,647,481 B1 | 11/2003 | Luu et al. |
| 6,654,193 B1 | 11/2003 | Thelin |
| 6,657,810 B1 | 12/2003 | Kupferman |
| 6,661,591 B1 | 12/2003 | Rothberg |
| 6,665,772 B1 | 12/2003 | Hamlin |
| 6,687,073 B1 | 2/2004 | Kupferman |
| 6,687,078 B1 | 2/2004 | Kim |
| 6,687,850 B1 | 2/2004 | Rothberg |
| 6,690,523 B1 | 2/2004 | Nguyen et al. |
| 6,690,882 B1 | 2/2004 | Hanmann et al. |
| 6,691,198 B1 | 2/2004 | Hamlin |
| 6,691,213 B1 | 2/2004 | Luu et al. |
| 6,691,255 B1 | 2/2004 | Rothberg et al. |
| 6,693,760 B1 | 2/2004 | Krounbi et al. |
| 6,694,477 B1 | 2/2004 | Lee |
| 6,697,914 B1 | 2/2004 | Hospodor et al. |
| 6,704,153 B1 | 3/2004 | Rothberg et al. |
| 6,708,251 B1 | 3/2004 | Boyle et al. |
| 6,710,951 B1 | 3/2004 | Cloke |
| 6,711,628 B1 | 3/2004 | Thelin |
| 6,711,635 B1 | 3/2004 | Wang |
| 6,711,660 B1 | 3/2004 | Milne et al. |
| 6,715,044 B2 | 3/2004 | Lofgren et al. |
| 6,724,982 B1 | 4/2004 | Hamlin |
| 6,725,329 B1 | 4/2004 | Ng et al. |
| 6,735,650 B1 | 5/2004 | Rothberg |
| 6,735,693 B1 | 5/2004 | Hamlin |
| 6,744,772 B1 | 6/2004 | Eneboe et al. |
| 6,745,283 B1 | 6/2004 | Dang |
| 6,751,402 B1 | 6/2004 | Elliott et al. |
| 6,757,481 B1 | 6/2004 | Nazarian et al. |
| 6,772,281 B2 | 8/2004 | Hamlin |
| 6,781,826 B1 | 8/2004 | Goldstone et al. |
| 6,782,449 B1 | 8/2004 | Codilian et al. |
| 6,791,779 B1 | 9/2004 | Singh et al. |
| 6,792,486 B1 | 9/2004 | Hanan et al. |
| 6,799,274 B1 | 9/2004 | Hamlin |
| 6,811,427 B2 | 11/2004 | Garrett et al. |
| 6,826,003 B1 | 11/2004 | Subrahmanyam |
| 6,826,614 B1 | 11/2004 | Hanmann et al. |
| 6,832,041 B1 | 12/2004 | Boyle |
| 6,832,929 B2 | 12/2004 | Garrett et al. |
| 6,845,405 B1 | 1/2005 | Thelin |
| 6,845,427 B1 | 1/2005 | Atai-Azimi |
| 6,850,443 B2 | 2/2005 | Lofgren et al. |
| 6,851,055 B1 | 2/2005 | Boyle et al. |
| 6,851,063 B1 | 2/2005 | Boyle et al. |
| 6,853,731 B1 | 2/2005 | Boyle et al. |
| 6,854,022 B1 | 2/2005 | Thelin |

(56) References Cited

U.S. PATENT DOCUMENTS

| | | |
|---|---|---|
| 6,862,660 B1 | 3/2005 | Wilkins et al. |
| 6,880,043 B1 | 4/2005 | Castro et al. |
| 6,882,486 B1 | 4/2005 | Kupferman |
| 6,884,085 B1 | 4/2005 | Goldstone |
| 6,888,831 B1 | 5/2005 | Hospodor et al. |
| 6,892,217 B1 | 5/2005 | Hanmann et al. |
| 6,892,249 B1 | 5/2005 | Codilian et al. |
| 6,892,313 B1 | 5/2005 | Codilian et al. |
| 6,895,455 B1 | 5/2005 | Rothberg |
| 6,895,500 B1 | 5/2005 | Rothberg |
| 6,898,730 B1 | 5/2005 | Hanan |
| 6,910,099 B1 | 6/2005 | Wang et al. |
| 6,928,470 B1 | 8/2005 | Hamlin |
| 6,931,439 B1 | 8/2005 | Hanmann et al. |
| 6,934,104 B1 | 8/2005 | Kupferman |
| 6,934,713 B2 | 8/2005 | Schwartz et al. |
| 6,940,873 B2 | 9/2005 | Boyle et al. |
| 6,943,978 B1 | 9/2005 | Lee |
| 6,948,165 B1 | 9/2005 | Luu et al. |
| 6,950,267 B1 | 9/2005 | Liu et al. |
| 6,954,733 B1 | 10/2005 | Ellis et al. |
| 6,961,814 B1 | 11/2005 | Thelin et al. |
| 6,965,489 B1 | 11/2005 | Lee et al. |
| 6,965,563 B1 | 11/2005 | Hospodor et al. |
| 6,965,966 B1 | 11/2005 | Rothberg et al. |
| 6,967,799 B1 | 11/2005 | Lee |
| 6,968,422 B1 | 11/2005 | Codilian et al. |
| 6,968,450 B1 | 11/2005 | Rothberg et al. |
| 6,973,495 B1 | 12/2005 | Milne et al. |
| 6,973,570 B1 | 12/2005 | Hamlin |
| 6,976,190 B1 | 12/2005 | Goldstone |
| 6,983,316 B1 | 1/2006 | Milne et al. |
| 6,986,007 B1 | 1/2006 | Procyk et al. |
| 6,986,154 B1 | 1/2006 | Price et al. |
| 6,995,933 B1 | 2/2006 | Codilian et al. |
| 6,996,501 B1 | 2/2006 | Rothberg |
| 6,996,669 B1 | 2/2006 | Dang et al. |
| 7,002,926 B1 | 2/2006 | Eneboe et al. |
| 7,003,674 B1 | 2/2006 | Hamlin |
| 7,006,316 B1 | 2/2006 | Sargenti, Jr. et al. |
| 7,009,820 B1 | 3/2006 | Hogg |
| 7,023,639 B1 | 4/2006 | Kupferman |
| 7,024,491 B1 | 4/2006 | Hanmann et al. |
| 7,024,549 B1 | 4/2006 | Luu et al. |
| 7,024,614 B1 | 4/2006 | Thelin et al. |
| 7,027,716 B1 | 4/2006 | Boyle et al. |
| 7,028,174 B1 | 4/2006 | Atai-Azimi et al. |
| 7,031,902 B1 | 4/2006 | Catiller |
| 7,046,465 B1 | 5/2006 | Kupferman |
| 7,046,488 B1 | 5/2006 | Hogg |
| 7,050,252 B1 | 5/2006 | Vallis |
| 7,054,937 B1 | 5/2006 | Milne et al. |
| 7,055,000 B1 | 5/2006 | Severston |
| 7,055,167 B1 | 5/2006 | Masters |
| 7,057,836 B1 | 6/2006 | Kupferman |
| 7,062,398 B1 | 6/2006 | Rothberg |
| 7,075,746 B1 | 7/2006 | Kupferman |
| 7,076,604 B1 | 7/2006 | Thelin |
| 7,082,494 B1 | 7/2006 | Thelin et al. |
| 7,088,538 B1 | 8/2006 | Codilian et al. |
| 7,088,545 B1 | 8/2006 | Singh et al. |
| 7,092,186 B1 | 8/2006 | Hogg |
| 7,095,577 B1 | 8/2006 | Codilian et al. |
| 7,099,095 B1 | 8/2006 | Subrahmanyam et al. |
| 7,106,537 B1 | 9/2006 | Bennett |
| 7,106,947 B2 | 9/2006 | Boyle et al. |
| 7,110,202 B1 | 9/2006 | Vasquez |
| 7,111,116 B1 | 9/2006 | Boyle et al. |
| 7,114,029 B1 | 9/2006 | Thelin |
| 7,120,737 B1 | 10/2006 | Thelin |
| 7,120,806 B1 | 10/2006 | Codilian et al. |
| 7,126,776 B1 | 10/2006 | Warren, Jr. et al. |
| 7,129,763 B1 | 10/2006 | Bennett et al. |
| 7,133,600 B1 | 11/2006 | Boyle |
| 7,136,244 B1 | 11/2006 | Rothberg |
| 7,146,094 B1 | 12/2006 | Boyle |
| 7,149,046 B1 | 12/2006 | Coker et al. |
| 7,150,036 B1 | 12/2006 | Milne et al. |
| 7,155,616 B1 | 12/2006 | Hamlin |
| 7,171,108 B1 | 1/2007 | Masters et al. |
| 7,171,110 B1 | 1/2007 | Wilshire |
| 7,194,576 B1 | 3/2007 | Boyle |
| 7,200,698 B1 | 4/2007 | Rothberg |
| 7,205,805 B1 | 4/2007 | Bennett |
| 7,206,497 B1 | 4/2007 | Boyle et al. |
| 7,215,496 B1 | 5/2007 | Kupferman et al. |
| 7,215,771 B1 | 5/2007 | Hamlin |
| 7,237,054 B1 | 6/2007 | Cain et al. |
| 7,240,161 B1 | 7/2007 | Boyle |
| 7,249,365 B1 | 7/2007 | Price et al. |
| 7,263,709 B1 | 8/2007 | Krapf |
| 7,274,639 B1 | 9/2007 | Codilian et al. |
| 7,274,659 B2 | 9/2007 | Hospodor |
| 7,275,116 B1 | 9/2007 | Hanmann et al. |
| 7,280,302 B1 | 10/2007 | Masiewicz |
| 7,292,774 B1 | 11/2007 | Masters et al. |
| 7,292,775 B1 | 11/2007 | Boyle et al. |
| 7,296,284 B1 | 11/2007 | Price et al. |
| 7,302,501 B1 | 11/2007 | Cain et al. |
| 7,302,579 B1 | 11/2007 | Cain et al. |
| 7,318,088 B1 | 1/2008 | Mann |
| 7,319,806 B1 | 1/2008 | Willner et al. |
| 7,325,244 B2 | 1/2008 | Boyle et al. |
| 7,330,323 B1 | 2/2008 | Singh et al. |
| 7,346,790 B1 | 3/2008 | Klein |
| 7,366,641 B1 | 4/2008 | Masiewicz et al. |
| 7,369,340 B1 | 5/2008 | Dang et al. |
| 7,369,343 B1 | 5/2008 | Yeo et al. |
| 7,372,650 B1 | 5/2008 | Kupferman |
| 7,380,147 B1 | 5/2008 | Sun |
| 7,392,340 B1 | 6/2008 | Dang et al. |
| 7,395,461 B2 | 7/2008 | Argon et al. |
| 7,404,013 B1 | 7/2008 | Masiewicz |
| 7,406,545 B1 | 7/2008 | Rothberg et al. |
| 7,415,571 B1 | 8/2008 | Hanan |
| 7,436,610 B1 | 10/2008 | Thelin |
| 7,437,502 B1 | 10/2008 | Coker |
| 7,440,214 B1 | 10/2008 | Ell et al. |
| 7,451,344 B1 | 11/2008 | Rothberg |
| 7,471,483 B1 | 12/2008 | Ferris et al. |
| 7,471,486 B1 | 12/2008 | Coker et al. |
| 7,486,060 B1 | 2/2009 | Bennett |
| 7,496,493 B1 | 2/2009 | Stevens |
| 7,518,819 B1 | 4/2009 | Yu et al. |
| 7,519,895 B2 | 4/2009 | Kyung et al. |
| 7,526,184 B1 | 4/2009 | Parkinen et al. |
| 7,539,924 B1 | 5/2009 | Vasquez et al. |
| 7,543,117 B1 | 6/2009 | Hanan |
| 7,551,383 B1 | 6/2009 | Kupferman |
| 7,562,282 B1 | 7/2009 | Rothberg |
| 7,577,973 B1 | 8/2009 | Kapner, III et al. |
| 7,596,797 B1 | 9/2009 | Kapner, III et al. |
| 7,599,139 B1 | 10/2009 | Bombet et al. |
| 7,619,841 B1 | 11/2009 | Kupferman |
| 7,647,544 B1 | 1/2010 | Masiewicz |
| 7,649,704 B1 | 1/2010 | Bombet et al. |
| 7,653,927 B1 | 1/2010 | Kapner, III et al. |
| 7,656,603 B1 | 2/2010 | Xing |
| 7,656,763 B1 | 2/2010 | Jin et al. |
| 7,657,149 B2 | 2/2010 | Boyle |
| 7,672,072 B1 | 3/2010 | Boyle et al. |
| 7,673,075 B1 | 3/2010 | Masiewicz |
| 7,688,540 B1 | 3/2010 | Mei et al. |
| 7,724,461 B1 | 5/2010 | McFayden et al. |
| 7,725,584 B1 | 5/2010 | Hanmann et al. |
| 7,730,295 B1 | 6/2010 | Lee |
| 7,760,458 B1 | 7/2010 | Trinh |
| 7,768,776 B1 | 8/2010 | Szeremeta et al. |
| 7,804,657 B1 | 9/2010 | Hogg et al. |
| 7,813,954 B1 | 10/2010 | Price et al. |
| 7,827,320 B1 | 11/2010 | Stevens |
| 7,839,588 B1 | 11/2010 | Dang et al. |
| 7,843,660 B1 | 11/2010 | Yeo |
| 7,852,596 B2 | 12/2010 | Boyle et al. |

(56) References Cited

U.S. PATENT DOCUMENTS

| | | |
|---|---|---|
| 7,859,782 B1 | 12/2010 | Lee |
| 7,872,822 B1 | 1/2011 | Rothberg |
| 7,898,756 B1 | 3/2011 | Wang |
| 7,898,762 B1 | 3/2011 | Guo et al. |
| 7,900,037 B1 | 3/2011 | Fallone et al. |
| 7,907,364 B2 | 3/2011 | Boyle et al. |
| 7,929,234 B1 | 4/2011 | Boyle et al. |
| 7,933,087 B1 | 4/2011 | Tsai et al. |
| 7,933,090 B1 | 4/2011 | Jung et al. |
| 7,934,030 B1 | 4/2011 | Sargenti, Jr. et al. |
| 7,940,491 B2 | 5/2011 | Szeremeta et al. |
| 7,944,639 B1 | 5/2011 | Wang |
| 7,945,727 B2 | 5/2011 | Rothberg et al. |
| 7,949,564 B1 | 5/2011 | Hughes et al. |
| 7,974,029 B2 | 7/2011 | Tsai et al. |
| 7,974,039 B1 | 7/2011 | Xu et al. |
| 7,982,993 B1 | 7/2011 | Tsai et al. |
| 7,984,200 B1 | 7/2011 | Bombet et al. |
| 7,990,648 B1 | 8/2011 | Wang |
| 7,992,179 B1 | 8/2011 | Kapner, III et al. |
| 8,004,785 B1 | 8/2011 | Tsai et al. |
| 8,006,027 B1 | 8/2011 | Stevens et al. |
| 8,013,920 B2 | 9/2011 | Dosluoglu et al. |
| 8,014,094 B1 | 9/2011 | Jin |
| 8,014,977 B1 | 9/2011 | Masiewicz et al. |
| 8,040,625 B1 | 10/2011 | Boyle et al. |
| 8,078,943 B1 | 12/2011 | Lee |
| 8,079,045 B2 | 12/2011 | Krapf et al. |
| 8,082,433 B1 | 12/2011 | Fallone et al. |
| 8,085,487 B1 | 12/2011 | Jung et al. |
| 8,089,719 B1 | 1/2012 | Dakroub |
| 8,090,902 B1 | 1/2012 | Bennett et al. |
| 8,090,906 B1 | 1/2012 | Blaha et al. |
| 8,091,112 B1 | 1/2012 | Elliott et al. |
| 8,094,396 B1 | 1/2012 | Zhang et al. |
| 8,094,401 B1 | 1/2012 | Peng et al. |
| 8,116,020 B1 | 2/2012 | Lee |
| 8,116,025 B1 | 2/2012 | Chan et al. |
| 8,134,793 B1 | 3/2012 | Vasquez et al. |
| 8,134,798 B1 | 3/2012 | Thelin et al. |
| 8,139,301 B1 | 3/2012 | Li et al. |
| 8,139,310 B1 | 3/2012 | Hogg |
| 8,144,419 B1 | 3/2012 | Liu |
| 8,145,452 B1 | 3/2012 | Masiewicz et al. |
| 8,149,528 B1 | 4/2012 | Suratman et al. |
| 8,154,812 B1 | 4/2012 | Boyle et al. |
| 8,159,768 B1 | 4/2012 | Miyamura |
| 8,161,328 B1 | 4/2012 | Wilshire |
| 8,164,849 B1 | 4/2012 | Szeremeta et al. |
| 8,174,780 B1 | 5/2012 | Tsai et al. |
| 8,190,575 B1 | 5/2012 | Ong et al. |
| 8,194,338 B1 | 6/2012 | Zhang |
| 8,194,340 B1 | 6/2012 | Boyle et al. |
| 8,194,341 B1 | 6/2012 | Boyle |
| 8,201,066 B1 | 6/2012 | Wang |
| 8,225,173 B2 | 7/2012 | Shasha |
| 8,255,768 B2 | 8/2012 | Hu et al. |
| 8,271,692 B1 | 9/2012 | Dinh et al. |
| 8,279,550 B1 | 10/2012 | Hogg |
| 8,281,218 B1 | 10/2012 | Ybarra et al. |
| 8,285,923 B2 | 10/2012 | Stevens |
| 8,289,656 B1 | 10/2012 | Huber |
| 8,305,705 B1 | 11/2012 | Roohr |
| 8,307,156 B1 | 11/2012 | Codilian et al. |
| 8,310,775 B1 | 11/2012 | Boguslawski et al. |
| 8,315,006 B1 | 11/2012 | Chahwan et al. |
| 8,316,263 B1 | 11/2012 | Gough et al. |
| 8,320,067 B1 | 11/2012 | Tsai et al. |
| 8,324,974 B1 | 12/2012 | Bennett |
| 8,332,695 B2 | 12/2012 | Dalphy et al. |
| 8,339,919 B1 | 12/2012 | Lee |
| 8,341,337 B1 | 12/2012 | Ong et al. |
| 8,350,628 B1 | 1/2013 | Bennett |
| 8,356,184 B1 | 1/2013 | Meyer et al. |
| 8,359,522 B2 | 1/2013 | Gunnam et al. |
| 8,370,683 B1 | 2/2013 | Ryan et al. |
| 8,375,225 B1 | 2/2013 | Ybarra |
| 8,375,274 B1 | 2/2013 | Bonke |
| 8,380,922 B1 | 2/2013 | DeForest et al. |
| 8,386,880 B2 | 2/2013 | Savin |
| 8,390,948 B2 | 3/2013 | Hogg |
| 8,390,952 B1 | 3/2013 | Szeremeta |
| 8,392,689 B1 | 3/2013 | Lott |
| 8,407,393 B1 | 3/2013 | Yolar et al. |
| 8,413,010 B1 | 4/2013 | Vasquez et al. |
| 8,417,566 B2 | 4/2013 | Price et al. |
| 8,421,663 B1 | 4/2013 | Bennett |
| 8,422,172 B1 | 4/2013 | Dakroub et al. |
| 8,427,770 B1 | 4/2013 | O'Dell et al. |
| 8,427,771 B1 | 4/2013 | Tsai |
| 8,429,343 B1 | 4/2013 | Tsai |
| 8,433,937 B1 | 4/2013 | Wheelock et al. |
| 8,433,977 B1 | 4/2013 | Vasquez et al. |
| 8,441,750 B1 | 5/2013 | Nangare et al. |
| 8,441,909 B1 | 5/2013 | Thayamballi et al. |
| 8,456,980 B1 | 6/2013 | Thayamballi |
| 8,458,526 B2 | 6/2013 | Dalphy et al. |
| 8,462,466 B2 | 6/2013 | Huber |
| 8,467,151 B1 | 6/2013 | Huber |
| 8,483,027 B1 | 7/2013 | Mak et al. |
| 8,489,841 B1 | 7/2013 | Strecke et al. |
| 8,493,679 B1 | 7/2013 | Boguslawski et al. |
| 8,499,198 B1 | 7/2013 | Messenger et al. |
| 8,514,506 B1 | 8/2013 | Li et al. |
| 8,525,707 B1 | 9/2013 | Zhang et al. |
| 8,554,741 B1 | 10/2013 | Malina |
| 8,560,759 B1 | 10/2013 | Boyle et al. |
| 8,576,509 B1 | 11/2013 | Hogg |
| 8,576,511 B1 | 11/2013 | Coker et al. |
| 8,578,100 B1 | 11/2013 | Huynh et al. |
| 8,578,242 B1 | 11/2013 | Burton et al. |
| 8,582,223 B1 | 11/2013 | Garani et al. |
| 8,582,231 B1 | 11/2013 | Kermiche et al. |
| 8,589,773 B1 | 11/2013 | Wang et al. |
| 8,593,753 B1 | 11/2013 | Anderson |
| 8,599,512 B2 | 12/2013 | Hogg |
| 8,605,379 B1 | 12/2013 | Sun |
| 8,611,031 B1 | 12/2013 | Tan et al. |
| 8,611,032 B2 | 12/2013 | Champion et al. |
| 8,612,798 B1 | 12/2013 | Tsai |
| 8,619,383 B1 | 12/2013 | Jung et al. |
| 8,619,508 B1 | 12/2013 | Krichevsky et al. |
| 8,619,529 B1 | 12/2013 | Liew et al. |
| 8,621,115 B1 | 12/2013 | Bombet et al. |
| 8,621,133 B1 | 12/2013 | Boyle |
| 8,625,224 B1 | 1/2014 | Lin et al. |
| 8,625,225 B1 | 1/2014 | Wang |
| 8,626,463 B2 | 1/2014 | Stevens et al. |
| 8,630,052 B1 | 1/2014 | Jung et al. |
| 8,631,188 B1 | 1/2014 | Heath et al. |
| 8,635,412 B1 | 1/2014 | Wilshire |
| 8,661,193 B1 | 2/2014 | Cobos et al. |
| 8,665,547 B1 | 3/2014 | Yeo et al. |
| 8,667,248 B1 | 3/2014 | Neppalli |
| 8,670,205 B1 | 3/2014 | Malina et al. |
| 8,671,250 B2 | 3/2014 | Lee |
| 8,681,442 B2 | 3/2014 | Hogg |
| 8,681,445 B1 | 3/2014 | Kermiche et al. |
| 8,683,295 B1 | 3/2014 | Syu et al. |
| 8,687,306 B1 | 4/2014 | Coker et al. |
| 8,687,307 B1 | 4/2014 | Patton, III |
| 8,687,313 B1 | 4/2014 | Selvaraj |
| 8,693,133 B1 | 4/2014 | Lee et al. |
| 8,698,492 B1 | 4/2014 | Mak et al. |
| 8,699,171 B1 | 4/2014 | Boyle |
| 8,699,172 B1 | 4/2014 | Gunderson et al. |
| 8,711,500 B1 | 4/2014 | Fong et al. |
| 8,711,506 B1 | 4/2014 | Giovenzana et al. |
| 8,711,665 B1 | 4/2014 | Abdul Hamid |
| 8,717,694 B1 | 5/2014 | Liew et al. |
| 8,717,695 B1 | 5/2014 | Lin et al. |
| 8,724,248 B2 | 5/2014 | Dhanda et al. |
| 8,730,612 B1 | 5/2014 | Haralson |
| 8,743,502 B1 | 6/2014 | Bonke et al. |

(56) References Cited

U.S. PATENT DOCUMENTS

| | | |
|---|---|---|
| 8,749,911 B1 | 6/2014 | Sun et al. |
| 8,753,146 B1 | 6/2014 | Szeremeta et al. |
| 8,755,136 B1 | 6/2014 | Ng et al. |
| 8,756,361 B1 | 6/2014 | Carlson et al. |
| 8,760,782 B1 | 6/2014 | Garani et al. |
| 8,760,792 B1 | 6/2014 | Tam |
| 8,769,593 B1 | 7/2014 | Schwartz et al. |
| 8,773,793 B1 | 7/2014 | McFadyen |
| 8,773,802 B1 | 7/2014 | Anderson et al. |
| 8,773,807 B1 | 7/2014 | Chia et al. |
| 8,773,957 B1 | 7/2014 | Champion et al. |
| 8,780,470 B1 | 7/2014 | Wang et al. |
| 8,782,334 B1 | 7/2014 | Boyle et al. |
| 8,786,976 B1 | 7/2014 | Kang et al. |
| 8,787,125 B1 | 7/2014 | Lee |
| 8,792,195 B2 | 7/2014 | Chang et al. |
| 8,792,196 B1 | 7/2014 | Lee |
| 8,792,200 B1 | 7/2014 | Tam et al. |
| 8,793,551 B2 | 7/2014 | Zhou et al. |
| 8,797,667 B1 | 8/2014 | Barlow et al. |
| 8,799,977 B1 | 8/2014 | Kapner, III et al. |
| 8,817,413 B1 | 8/2014 | Knigge et al. |
| 8,817,584 B1 | 8/2014 | Selvaraj |
| 8,825,976 B1 | 9/2014 | Jones |
| 8,825,977 B1 | 9/2014 | Syu et al. |
| 8,854,755 B2 | 10/2014 | Chang et al. |
| 8,914,705 B1 | 12/2014 | Zeng et al. |
| 8,924,824 B1 | 12/2014 | Lu |
| 8,941,943 B1 | 1/2015 | Coker et al. |
| 8,947,804 B2 | 2/2015 | Li et al. |
| 8,947,812 B1 | 2/2015 | Wang |
| 8,966,339 B1 | 2/2015 | Lu |
| 8,972,826 B2 | 3/2015 | Lu |
| 8,977,941 B2 | 3/2015 | Chaichanavong et al. |
| 9,013,821 B1 | 4/2015 | Chen |
| 9,013,824 B1 | 4/2015 | Guo et al. |
| 9,013,920 B2 | 4/2015 | Stoev et al. |
| 9,019,914 B2 | 4/2015 | Liu |
| 9,037,951 B2 | 5/2015 | Cideciyan et al. |
| 9,059,737 B2 | 6/2015 | Coker et al. |
| 9,059,742 B1 | 6/2015 | Anderson et al. |
| 9,071,266 B2 | 6/2015 | Wu et al. |
| 9,203,434 B1 | 12/2015 | Garani |
| 9,257,146 B1 | 2/2016 | Wang et al. |
| 2005/0149841 A1 | 7/2005 | Kyung et al. |
| 2007/0044000 A1 | 2/2007 | Shen et al. |
| 2009/0027242 A1 | 1/2009 | Cideciyan et al. |
| 2009/0113702 A1 | 5/2009 | Hogg |
| 2010/0185914 A1 | 7/2010 | Tan et al. |
| 2010/0306551 A1 | 12/2010 | Meyer et al. |
| 2011/0226729 A1 | 9/2011 | Hogg |
| 2012/0159042 A1 | 6/2012 | Lott et al. |
| 2012/0275050 A1 | 11/2012 | Wilson et al. |
| 2012/0281963 A1 | 11/2012 | Krapf et al. |
| 2012/0324980 A1 | 12/2012 | Nguyen et al. |
| 2015/0026541 A1 | 1/2015 | Zhang et al. |
| 2015/0058704 A1 | 2/2015 | Schell et al. |

\* cited by examiner

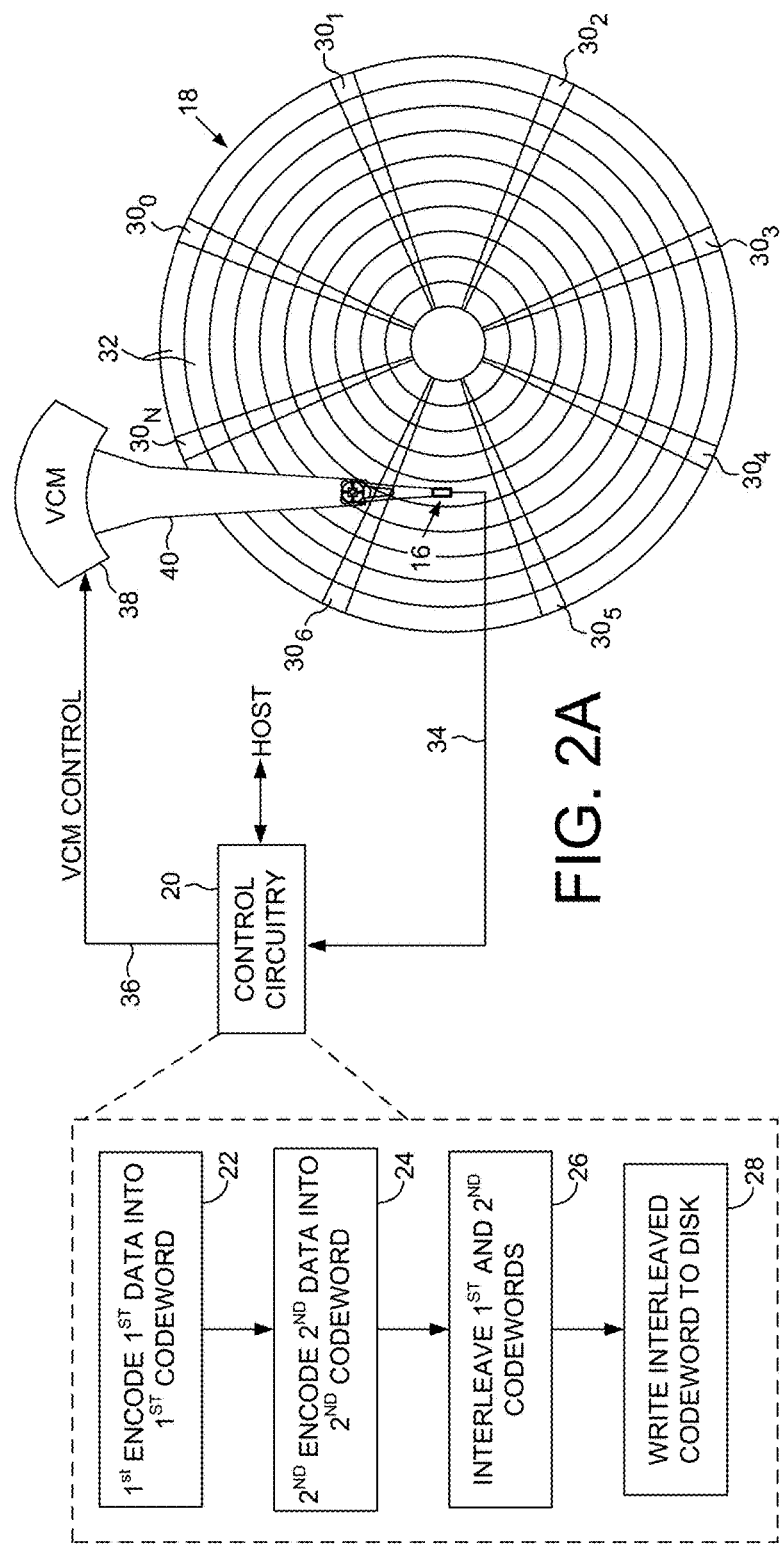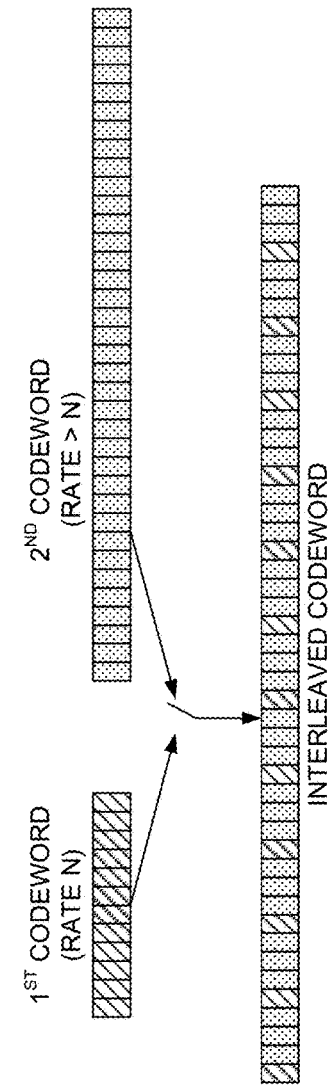

DATA STORAGE DEVICE ENCODING AND INTERLEAVING CODEWORDS TO IMPROVE TRELLIS SEQUENCE DETECTION

CROSS-REFERENCE TO RELATED APPLICATIONS

This application is a continuation of U.S. patent application Ser. No. 15/157,289, filed on May 17, 2016, entitled "DATA STORAGE DEVICE ENCODING AND INTERLEAVING CODEWORDS TO IMPROVE TRELLIS SEQUENCE DETECTION," which is a continuation-in-part of U.S. patent application Ser. No. 14/930,898, filed on Nov. 3, 2015, entitled "DATA STORAGE DEVICE ENCODING AND INTERLEAVING CODEWORDS TO IMPROVE TRELLIS SEQUENCE DETECTION;" the disclosures of which are hereby incorporated by reference in their entirety.

BACKGROUND

Data storage devices such as disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the actuator arm as it seeks from track to track.

FIG. 1 shows a prior art disk format 2 as comprising a number of servo tracks 4 defined by servo sectors $6_0$-$6_N$ recorded around the circumference of each servo track. Each servo sector $6_i$ comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a servo track address, used to position the head over a target data track during a seek operation. Each servo sector $6_i$ further comprises groups of servo bursts 14 (e.g., N and Q servo bursts), which are recorded with a predetermined phase relative to one another and relative to the servo track centerlines. The phase based servo bursts 14 provide fine head position information used for centerline tracking while accessing a data track during write/read operations. A position error signal (PES) is generated by reading the servo bursts 14, wherein the PES represents a measured position of the head relative to a centerline of a target servo track. A servo controller processes the PES to generate a control signal applied to a head actuator (e.g., a voice coil motor) in order to actuate the head radially over the disk in a direction that reduces the PES.

BRIEF DESCRIPTION OF THE DRAWINGS

FIG. 2A shows a data storage device in the form of a disk drive according to an embodiment comprising a head actuated over a disk.

FIG. 2B is a flow diagram according to an embodiment wherein first and second mixed rate codewords are interleaved to generate an interleaved codeword written to the disk.

FIG. 2C shows an embodiment wherein a first codeword having a code rate of N is interleaved with a larger, second codeword having a code rate greater than N.

DETAILED DESCRIPTION

Figure 1:
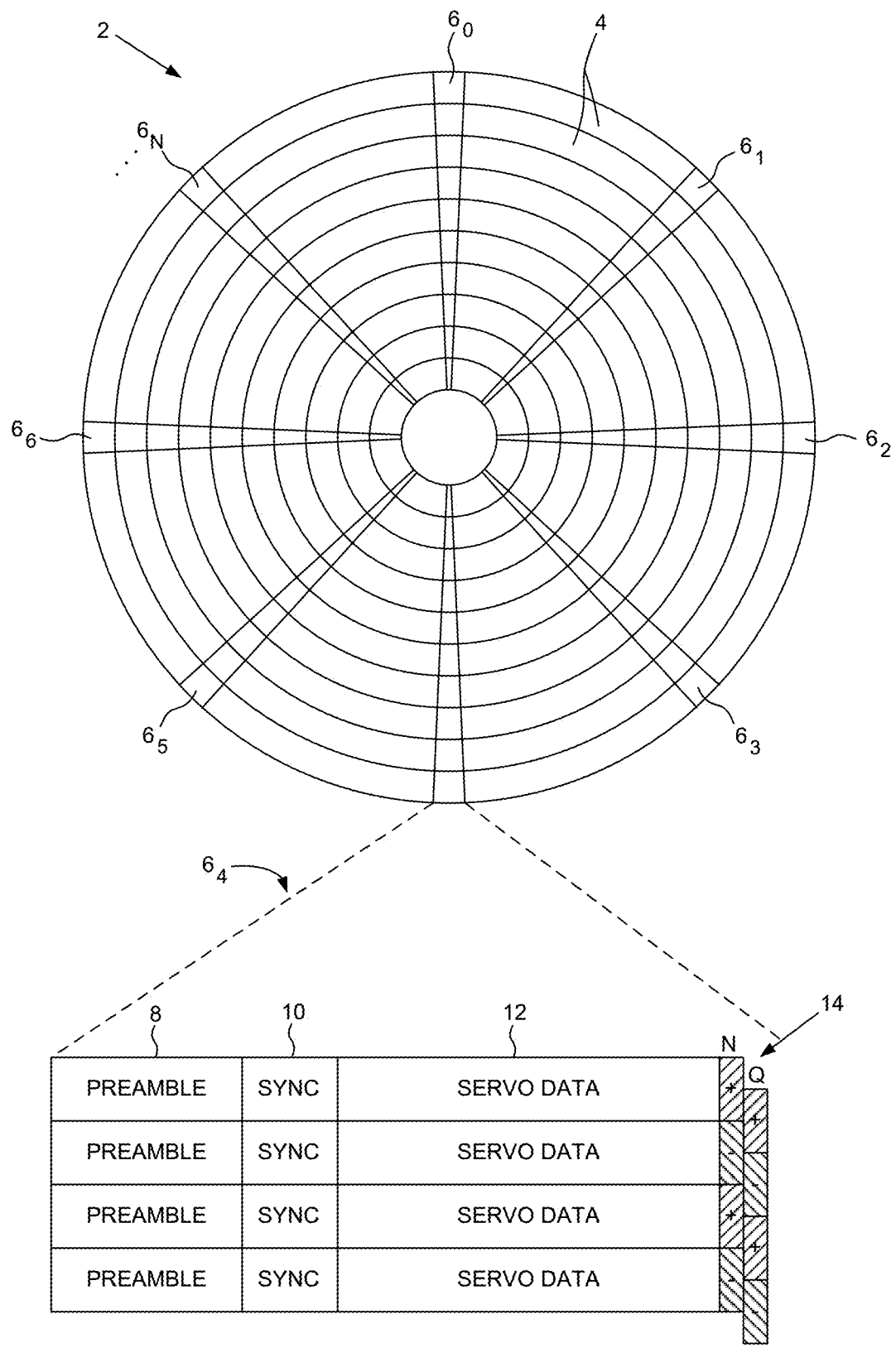
FIG. 1 shows a prior art disk format comprising a plurality of servo tracks defined by servo sectors.

FIG. 2A shows a data storage device in the form of a disk drive according to an embodiment comprising a head 16 actuated over a disk 18. The disk drive further comprises control circuitry 20 configured to execute the flow diagram of FIG. 2B, wherein first data is encoded into a first codeword (block 22), and second data is encoded into a second codeword (block 24). The first codeword and the second codeword are interleaved to generate an interleaved codeword (block 26) that is written to the disk (block 28). In one embodiment, a first code rate of the first codeword is less than a second code rate of the second codeword as illustrated in the example shown in FIG. 2C. Also in the embodiment of FIG. 2C, the first codeword is smaller in size than the second codeword such that the code rate of the concatenated (interleaved) codeword achieves a desired format efficiency when written to the disk. As described in greater detail below, in one embodiment the lower code rate of the first codeword improves the probability of successfully decoding the first codeword, and when the first codeword is successfully decoded (or nearly decoded), the corresponding reliability metrics may improve the accuracy of a trellis detector when performing subsequent iterations to recover the second codeword.

In the embodiment of FIG. 2A, the disk 18 comprises a plurality of servo sectors $30_0$-$30_N$ that define a plurality of servo tracks 32, wherein data tracks are defined relative to the servo tracks at the same or different radial density. The control circuitry 20 processes a read signal 34 emanating from the head 16 to demodulate the servo sectors $30_0$-$30_N$ and generate a position error signal (PES) representing an error between the actual position of the head and a target position relative to a target track. A servo control system in the control circuitry 20 filters the PES using a suitable compensation filter to generate a control signal 36 applied to a voice coil motor (VCM) 38 which rotates an actuator arm 40 about a pivot in order to actuate the head 16 radially over the disk 18 in a direction that reduces the PES. The servo sectors $30_0$-$30_N$ may comprise any suitable head position information, such as a track address for coarse positioning and servo bursts for fine positioning. The servo bursts may comprise any suitable pattern, such as an amplitude based servo pattern or a phase based servo pattern (FIG. 1).

Figure 3:
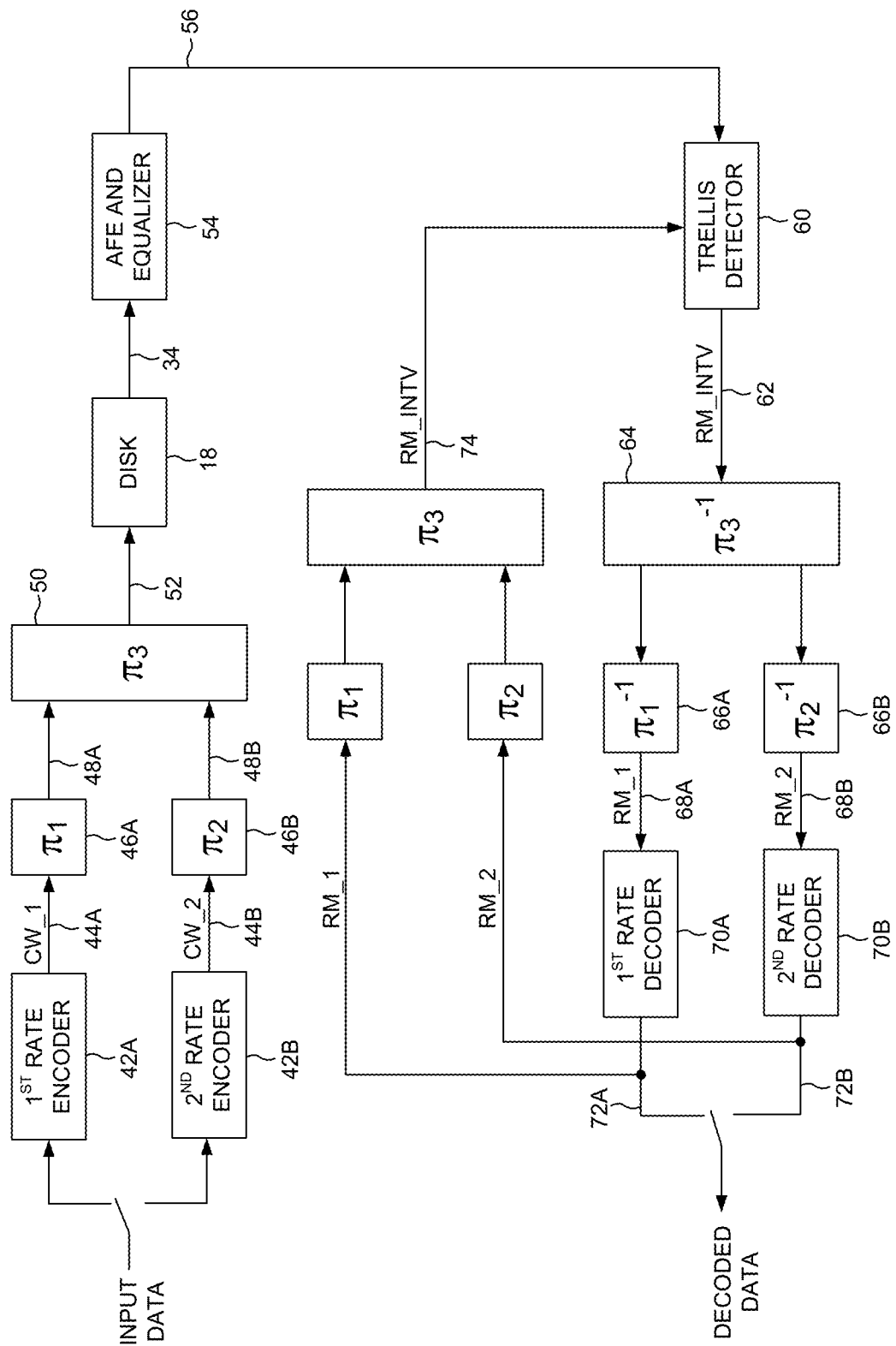
FIG. 3 shows control circuitry according to an embodiment wherein the lower rate of the first codeword increases the accuracy of a trellis detector during a second and subsequent global iterations.

FIG. 3 shows control circuitry according to an embodiment wherein first data is encoded by a first rate encoder 42A to generate a first codeword 44A, and second data is encoded by a second rate encoder 42B to generate a second codeword 44B. The encoders may operate according to any suitable encoding scheme, such as a low density parity check (LDPC) code, and the encoders may generate the codewords having any suitable code rate and size. In one embodiment, the first codeword 44A may be 1 K in size and encoded to have a code rate of 0.65, and the second codeword 44B may be 3 K in size and encoded to have a code rate of 0.85, such that the concatenated, interleaved codeword may be 4 K in size and have an overall code rate of 0.8 which is proximate to the code rate of the larger, second codeword 44B.

A first non-uniform interleaver 46A interleaves the first codeword 44A to generate a first non-uniform interleaved codeword 48A, and a second non-uniform interleaver 46B interleaves the second codeword 44B to generate a second non-uniform interleaved codeword 48B. Any suitable non-uniform interleaver may be employed, wherein in one embodiment the non-uniform interleavers 46A and 46B operate to randomly interleave the symbols of the respective codewords. In one embodiment, randomly interleaving the symbols of each codeword improves the performance of an iterative detection scheme, such as with an outer LDPC code and an inner trellis detector. In the embodiment of FIG. 3, a uniform interleaver 50 interleaves the first and second non-uniform interleaved codewords 48A and 48B to generate the interleaved codeword 52 written to the disk 18. In the embodiment, the uniform interleaver 50 interleaves the codewords 48A and 48B based on the ratio of the codeword sizes. For example in an embodiment where the first non-uniform interleaved codeword 48A is 1 K in size and the second non-uniform interleaved codeword 48B is 3 K in size, the uniform interleaver 50 may perform a 1:3 interleaving of the symbols such that there is a repeating sequence of one symbol from the first codeword 48A followed by three symbols from the second codeword 48B (e.g., as illustrated in FIG. 2C).

During a read operation, the read signal 34 is processed by an analog-front-end (AFE) and equalizer circuitry 54 (which may comprise analog circuitry or digital circuitry or a combination of both). For example, in one embodiment block 54 may comprise an analog equalizer, followed by a sampler for sampling the read signal, followed by a digital equalizer that equalizes the signal samples based on a suitable response, such as a suitable partial response (e.g., PR4). The equalized signal samples 56 are input into a trellis detector 60 which processes the signal samples to generate a sequence of reliability metrics 62 representing the interleaved codeword that was written to the disk. Any suitable trellis detector 60 may be employed, such as a soft-input soft-output Viterbi detector or a Bahl, Cocke, Jelinek and Raviv (BCJR) detector. In addition, the trellis detector 60 may generate any suitable reliability metric for each symbol in the interleaved codeword, such as a log-likelihood ratio (LLR) representing a likelihood that each symbol was detected correctly.

A uniform de-interleaver 64 and respective non-uniform de-interleavers 66A and 66B de-interleave the sequence of reliability metrics 62 output by the trellis detector 60 into a first set of reliability metrics 68A representing the first codeword 44A and a second set of reliability metrics 68B representing the second codeword 44B. A first rate decoder 70A decodes the first set of reliability metrics 68A to generate a third set of reliability metrics 72A representing the first codeword 44A, and a second rate decoder 70B decodes the second set of reliability metrics 68B to generate a fourth set of reliability metrics 72B representing the second codeword 44B. The third set of reliability metrics 72A and the fourth set of reliability metrics 72B are re-interleaved to generate interleaved reliability metrics 74 representing the interleaved codeword. The interleaved reliability metrics 74 are input into the trellis detector 60 which performs another iteration to generate another sequence of reliability metrics 62 representing the interleaved codeword that was written to the disk.

In one embodiment, the decoders 70A and 70B execute local iterations on the respective sets of reliability metrics 68A and 68B. If the decoders reach their maximum iteration limit, the codeword is considered unrecoverable during the current global iteration, and therefore the current reliability metrics 72A and 72B generated by the decoders are re-interleaved and fed back to the trellis detector 60. In one embodiment, the increased redundancy that causes the lower code rate of the first codeword 44A helps improve the accuracy of the first rate decoder 70A such that the probability of successfully decoding the first codeword increases. If the first codeword is successfully decoded, but the second codeword is not successfully decoded, the reliability metrics 72A for the first codeword will be 100% which, as described below, effectively prunes branches from the trellis of the trellis detector 60. Even if the first codeword is not successfully decoded, the interim reliability metrics 72A generated by the first rate decoder 70A may be more accurate (i.e., closer to 100%) due to the increase in redundancy of the first codeword 44A. In either case, the higher reliability metrics 72A of the first codeword 44A bias the trellis detector 60 during the next global iteration so as to improve the accuracy of the trellis detector (for either or both of the codewords). That is, interleaving the higher reliability metrics 72A of the first codeword 44A with the lower reliability metrics 72B of the second codeword 44B may improve the accuracy of the trellis detector by pruning or biasing the branches corresponding to the symbols of the first codeword 44A.

Figure 4A:
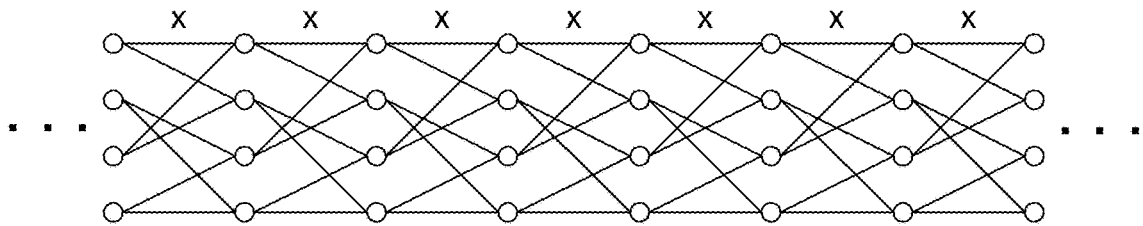
FIGS. 4A and 4B illustrate that when the first codeword is successfully decoded, the corresponding reliability metrics effectively prune branches from the trellis of the trellis detector when performing subsequent iterations to recover the second codeword.
Figure 4B:
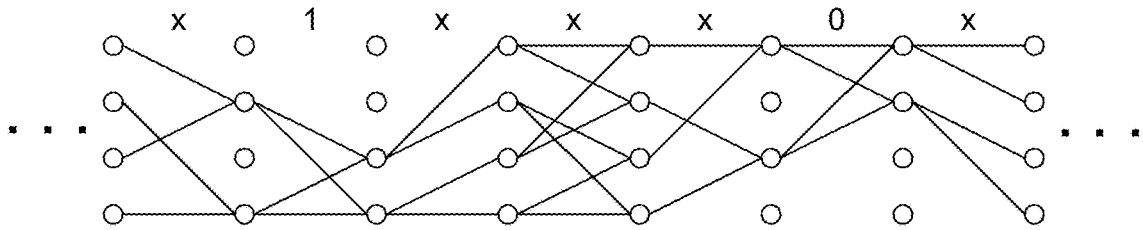

FIGS. 4A and 4B illustrate how in one embodiment the lower rate of the first codeword 44A may prune the corresponding branches of the trellis during a second or subsequent global iteration. FIG. 4A shows a full trellis as implemented during the first global iteration wherein the symbols of both the first and second codeword are unknown. During a subsequent global iteration, the first codeword 44A may be successfully decoded by the first rate decoder 70A due to the lower code rate of the first codeword 44A. Accordingly as shown in FIG. 4B, the branches that correspond to the known symbols of the first codeword 44A are pruned from the trellis which increases the accuracy of the trellis detector 60 when detecting the symbols of the second codeword 44B. In one embodiment, the branches of the trellis may be literally pruned from the trellis based on the known symbols of the first codeword 44A, and in another embodiment, the reliability metrics being 100% for each symbol of the first codeword 44A biases the trellis so as to effectively prune the corresponding branches from the trellis.

Figure 5:
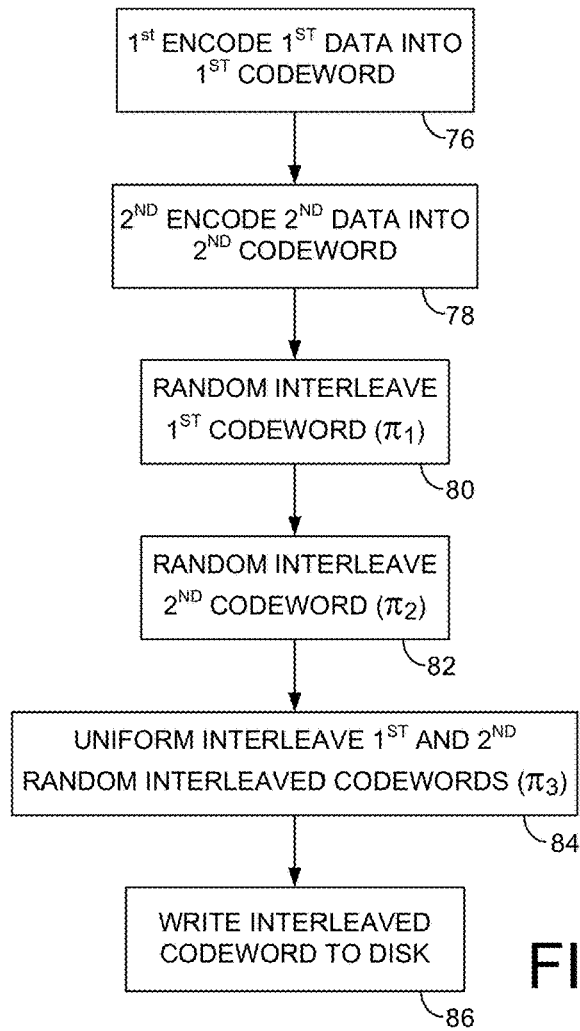
FIG. 5 is a flow diagram according to an embodiment wherein the encoded codewords are first interleaved in a non-uniform (e.g., random) manner, and then the non-uniform interleaved codewords are interleaved in a uniform manner to generate an interleaved codeword written to the disk.

FIG. 5 is a flow diagram according to an embodiment wherein first data is encoded into a first codeword (block 76), and second data is encoded into a second codeword (block 78). A non-uniform interleaving of the first codeword is executed to generate a first non-uniform interleaved codeword (block 80), and a non-uniform interleaving of the second codeword is executed to generate a second non-uniform interleaved codeword (block 82). A uniform interleaving of the first non-uniform interleaved codeword and the second non-uniform interleaved codeword is executed to generate an interleaved codeword (block 84), and the interleaved codeword is written to the disk (block 86). In one embodiment, the first codeword has a rate and/or size that is different from a rate and/or size of the second codeword as described above. In another embodiment, the first and second codewords may have the same rate and/or the same size. As described above, interleaving the codewords using a uniform interleaver may improve the accuracy of a trellis detector, particularly when the decoding of one of the codewords provides higher reliability metrics for the second and subsequent global iterations by the trellis detector.

Figure 6A:
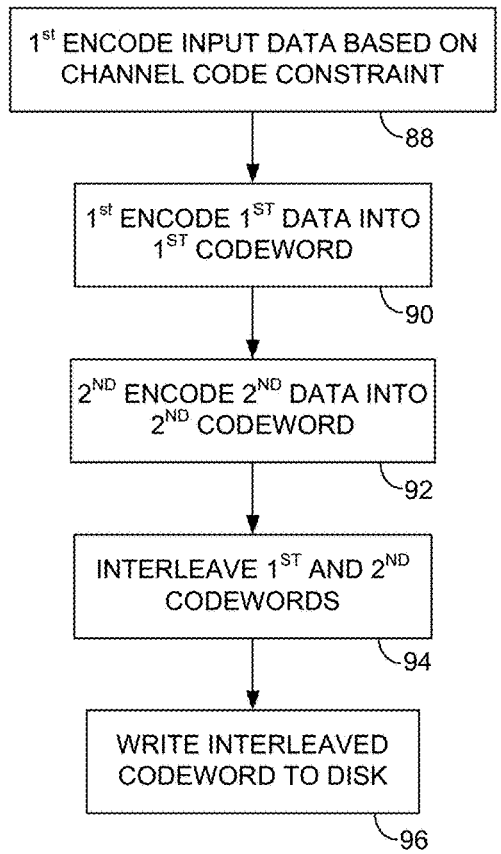
FIG. 6A is a flow diagram according to an embodiment wherein input data is first encoded based on a channel code, and then encoded into first and second codewords having different code rates.
Figure 6B:
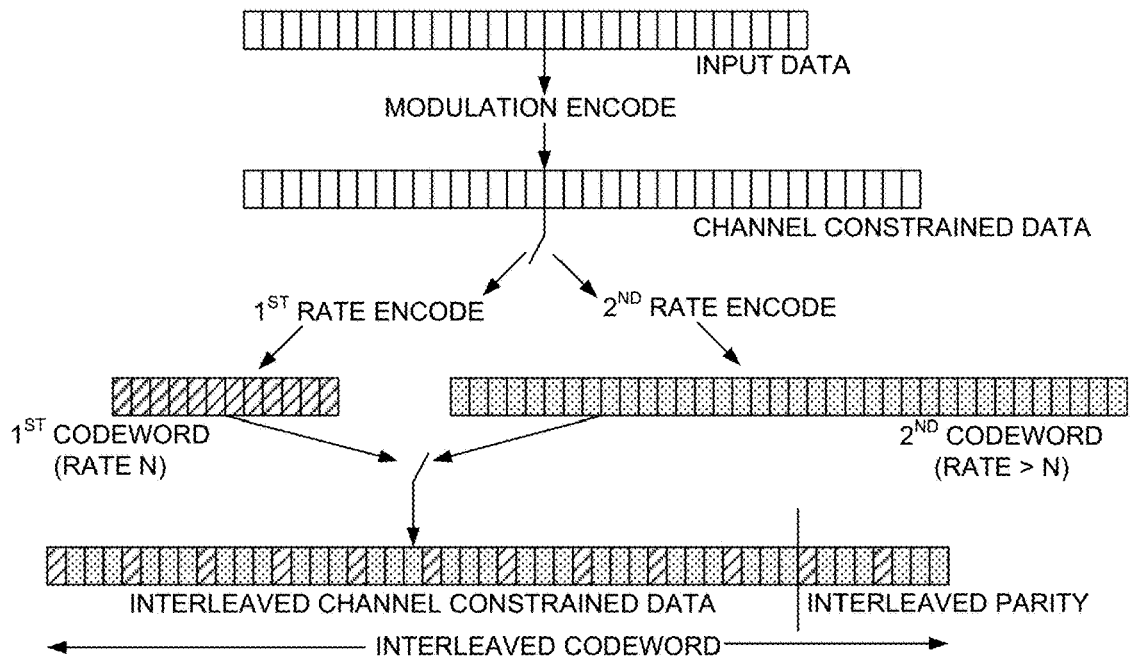
FIG. 6B shows an embodiment wherein the parity data of the interleaved codeword is not encoded based on the channel code constraint.

FIG. 6A is a flow diagram according to an embodiment which is understood with reference to FIG. 6B, wherein input data is encoded according to at least one channel code constraint to generate first data and second data (block 88). The first data is encoded into a first codeword (block 90), and the second data is encoded into a second codeword (block 92), wherein a first code rate of the first codeword is less than a second code rate of the second codeword. The first codeword and the second codeword are interleaved to generate an interleaved codeword (block 94), and the interleaved codeword is written to the storage medium (block 96).

The input data may be encoded based a channel code constraint that implements any suitable modulation code. Examples of a suitable modulation code include a run-length limited (RLL) code which constrains the minimum and maximum run-length of zero bits (in NRZI recording), or a maximum transition run (MTR) code which constrains the maximum run-length of zero bits and run-length of one bits. Other examples of a suitable modulation code include trellis codes, DC free codes, matched spectral null codes, and other codes directed at increasing the effective signal-to-noise ratio (SNR) of the recording channel.

Figure 7:
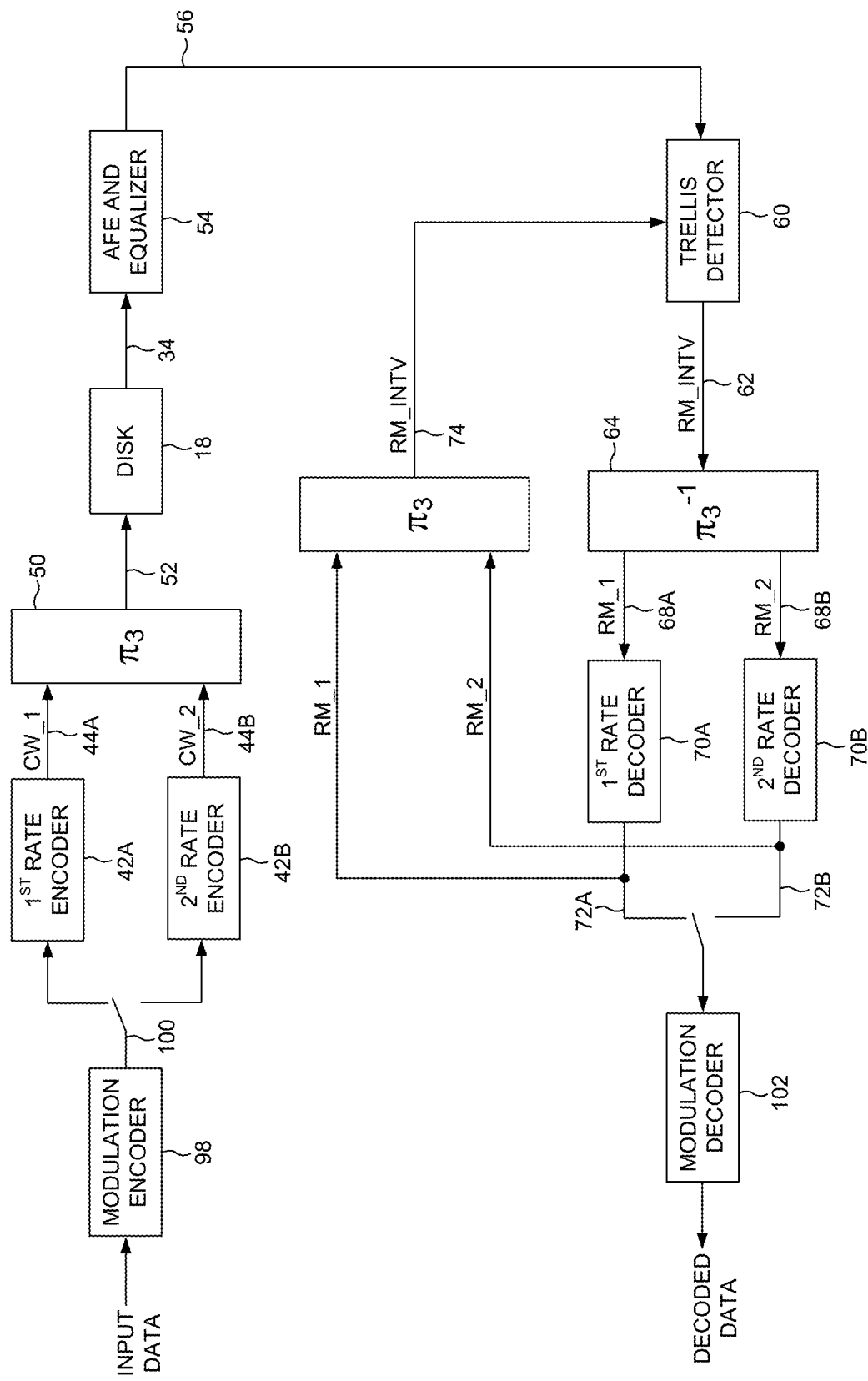
FIG. 7 shows control circuitry according to an embodiment comprising a modulation decoder for decoding the interleaved codeword output by the multi-rate decoders.

FIG. 7 shows control circuitry according to an embodiment wherein a suitable modulation encoder 98 encodes the input data based on the channel code constraint to generate channel constrained data 100. A first number of bytes (e.g., 1 K bytes) of the channel constrained data 100 are then encoded by the $1^{st}$ rate encoder 42A, and a second number of bytes (e.g., 3 K bytes) of the channel constrained data 100 are encoded by the $2^{nd}$ rate encoder 42B. The resulting $1^{st}$ codeword 44A and second codeword 44B are interleaved using the uniform interleaver 50 to generate the interleaved codeword 52 such as shown in FIG. 6B. In this embodiment, the interleaved codeword 52 written to the storage medium comprises two interleaved codewords each comprising channel constrained data sections and parity data that is not encoded according to the channel code constraint, thereby maintaining the modulation code as the outer code and the multi-rate code as the inner code. During a read operation, the interleaved codeword is detected/decoded using local and global iterations through the trellis detector 60 and multi-rate decoders 70A and 70B as described above. Once the interleaved codeword has been successfully recovered, the data sections of each decoded codeword 72A and 72B are decoded using a suitable modulation decoder 102.

In one embodiment, the interleaved codeword comprises an interleave segment length that defines the interleaving frequency of symbols from each codeword. In the example of FIG. 6B, the interleave segment length is four since there is one symbol from the first codeword inserted after every three symbols from the second codeword. In one embodiment, the interleave segment length is less than or equal to the run-length of the channel code constraint. For example, if the modulation code is an MTR(3, ∞) code, the maximum run-length of consecutive "1" bits is three such that runs of four and longer are eliminated from the interleaved codewords. In this embodiment, selecting the interleave segment length to be less than or equal to the run-length may increase the benefit of the mixed-rate, interleaved codewords. Referring again to the example of FIG. 6B, the uniform interleaving breaks up runs of four bits of the higher rate, second codeword which is similar to limiting the run-length of "1" bits in the second codeword to three bits. Decreasing the interleave segment length of the interleaved codeword to three, such that there is one symbol from the first codeword inserted after every two symbols form the second codeword, breaks up runs of three bits of the higher rate, second codeword. This embodiment may improve the overall performance since the run-length of the channel code breaks up runs of four bits in both codewords, and the interleave segment length breaks up runs of three bits in the second codeword.

Figure 8:
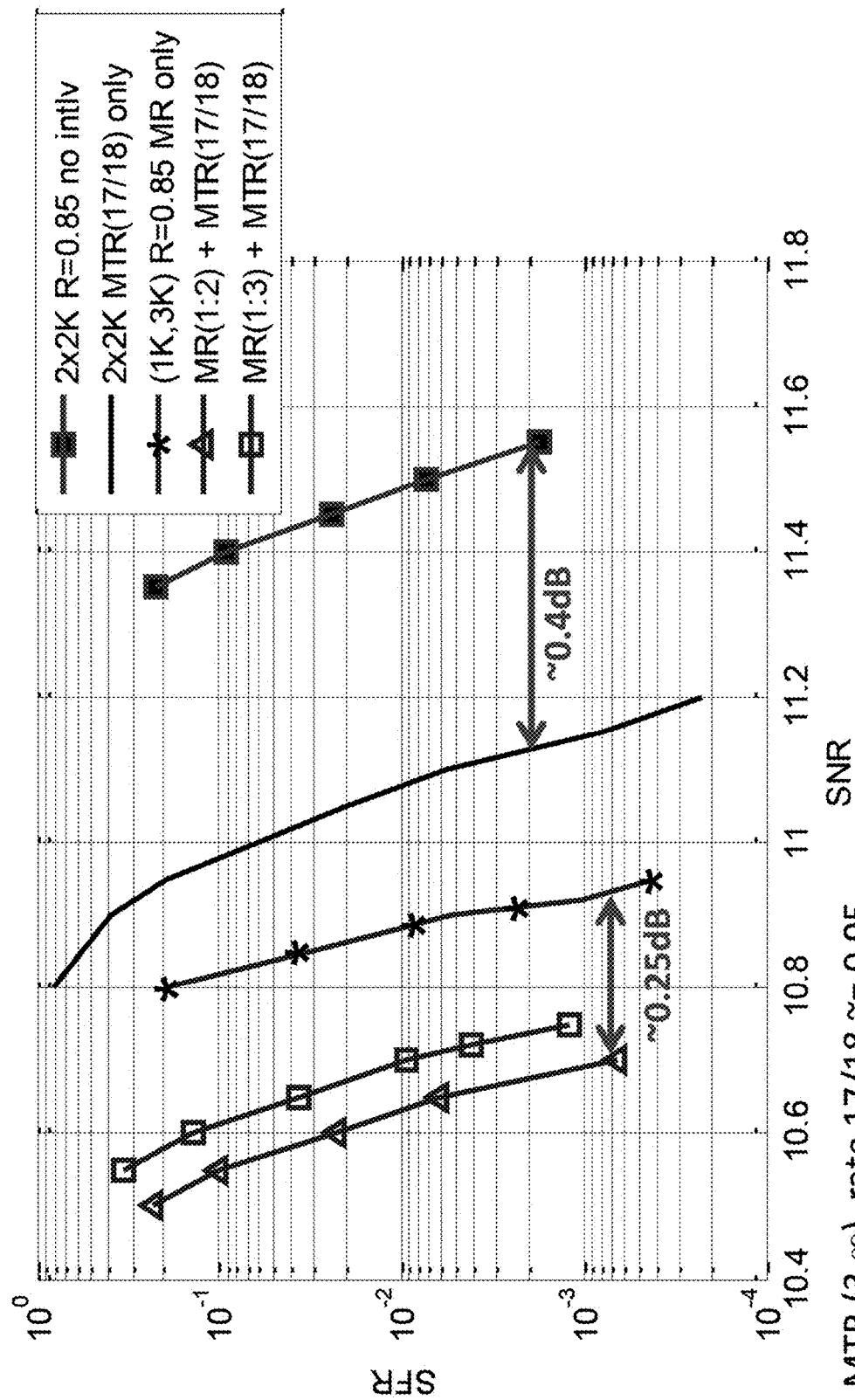
FIG. 8 illustrates performance comparisons (sector failure rate (SFR) versus SNR) for different embodiments employing different encoding schemes.

FIG. 8 illustrates the performance comparisons (sector failure rate (SFR) versus SNR) for different embodiments employing different encoding schemes, including:

2×2K R=0.85 no intlv—encoding 4K byte input data into two 2K byte codewords having the same rate (0.85) without interleaving and without a modulation code.

2×2K MTR(17/18) only—encoding 4K byte input data into two 2K byte codewords using a MTR(3, ∞) modulation code with rate 17/18 code.

(1K, 3K) R=0.85 MR only—encoding 4K byte input data into a 1K byte codeword and a 3K byte codeword having mixed rates (MR) with interleaving and no modulation code.

MR(1:3)+MTR(17/18)—encoding 4K byte input data into a 1K byte codeword and a 3K byte codeword having mixed rates (MR) with interleaving (segment length of four) and MTR(3, ∞) modulation code with rate 17/18.

MR(1:2)+MTR(17/18)—encoding 4K byte input data into a 1K byte codeword and a 2K byte codeword having mixed rates (MR) with interleaving (segment length of three) and MTR(3, ∞) modulation code with rate 17/18.

In the above examples, the mixed rate (MR) encoding of the codewords without the modulation code generates the interleaved codeword having a code rate of 0.85, and the MR encoding of the codewords with the modulation code generates the interleaved codeword having the same 0.85 rate (0.9 rate MR encoding combined with 17/18 rate MTR encoding results in 0.9×17/18=0.85). Accordingly, increasing the rate of the MR code and combining a modulation code enables improved performance without losing capacity, with further performance gain possible when the interleave segment length is selected to be less than or equal to the run-length of the channel code constraint of the modulation code.

In the embodiments described above, the symbols of two codewords are interleaved to generate the interleaved codeword written to the disk. However, in other embodiments more than two codewords may be interleaved, wherein the code rate and/or size of each codeword as well as the symbol size for each codeword may vary (or be the same). For example, in one embodiment each codeword may have a progressively higher code rate and larger size (and optionally a larger symbol size), wherein the lower code rate codewords may be more readily decoded due to the increase in redundancy. In another embodiment when interleaving three or more codewords having the same or different code rate and/or size, the likelihood of successfully decoding at least one of the codewords may improve which may then cascade into the ability to successfully recover the remaining codewords.

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a disk controller, or certain operations described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

In various embodiments, a disk drive may include a magnetic disk drive, an optical disk drive, etc. In addition, while the above examples concern a disk drive, the various embodiments are not limited to a disk drive and can be applied to other data storage devices and systems, such as magnetic tape drives, solid state drives, hybrid drives, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A controller for use in a data storage device, comprising:
   a communication interface configured to communicate data with a storage medium of a data storage device; and
   a processor in data communication with the communication interface and configured to:
      encode input data according to at least one channel code constraint to generate first data and second data;
      encode the first data into a first codeword;
      encode the second data into a second codeword, wherein a first code rate of the first codeword is less than a second code rate of the second codeword;
      interleave the first codeword and the second codeword to generate an interleaved codeword; and
      control the communication interface to write the interleaved codeword to the storage medium.

2. The controller as recited in claim 1, wherein the interleaved codeword comprises parity data not encoded according to the at least one channel code constraint.

3. The controller as recited in claim 1, wherein the at least one channel code constraint is a maximum transition run (MTR) constraint.

4. The controller as recited in claim 1, wherein the at least one channel code constraint is a run-length limit (RLL) constraint.

5. The controller as recited in claim 1, wherein the processor is configured to encode the first and second data using a low density parity check (LDPC) code.

6. The controller as recited in claim 1, wherein:
   the channel code constraint limits at least one of a maximum transition run (MTR) length and a maximum run-length limit (RLL);
   the interleaved codeword comprises an interleave segment length; and
   the interleave segment length is less than or equal to the run-length of the channel code constraint.

7. Control circuitry for use in a data storage device, the control circuitry configured to:
   encode input data according to at least one channel code constraint to generate first data and second data;
   encode the first data into a first codeword;
   encode the second data into a second codeword, wherein a first code rate of the first codeword is less than a second code rate of the second codeword;
   interleave the first codeword and the second codeword to generate an interleaved codeword; and
   write the interleaved codeword to a storage medium of a data storage device.

8. The control circuitry as recited in claim 7, wherein the interleaved codeword comprises parity data not encoded according to the at least one channel code constraint.

9. The control circuitry as recited in claim 7, wherein the at least one channel code constraint is a maximum transition run (MTR) constraint.

10. The control circuitry as recited in claim 7, wherein the at least one channel code constraint is a run-length limit (RLL) constraint.

11. The control circuitry as recited in claim 7, wherein the control circuitry is further configured to:
   read the interleaved codeword from the storage medium to generate a read signal;
   sample the read signal to generate signal samples;
   process the signal samples with a trellis detector to generate a sequence of reliability metrics representing the interleaved codeword;
   de-interleave the sequence of reliability metrics into a first set of reliability metrics representing the first codeword and a second set of reliability metrics representing the second codeword;
   decode the first set of reliability metrics to generate a third set of reliability metrics representing the first codeword;
   decode the second set of reliability metrics to generate a fourth set of reliability metrics representing the second codeword;
   interleave the third set of reliability metrics and the fourth set of reliability metrics to generate interleaved reliability metrics representing the interleaved codeword; and
   process the interleaved reliability metrics with the trellis detector.

12. The control circuitry as recited in claim 11, wherein the first code rate of the first codeword increases the accuracy of the trellis detector when processing the interleaved reliability metrics.

13. The control circuitry as recited in claim 11, wherein the trellis detector implements a soft-input soft-output Viterbi algorithm.

14. The control circuitry as recited in claim 11, wherein the control circuitry is further configured to:
   decode the interleaved codeword based on the at least one channel code constraint.

15. The control circuitry as recited in claim 7, wherein the control circuitry is further configured to encode the first and second data using a low density parity check (LDPC) code.

16. The control circuitry as recited in claim 7, wherein:
   the channel code constraint limits at least one of a maximum transition run (MTR) length and a maximum run-length limit (RLL);
   the interleaved codeword comprises an interleave segment length; and
   the interleave segment length is less than or equal to the run-length of the channel code constraint.

17. A data storage device comprising:
   a storage medium; and
   a controller configured to communicate data with the storage medium and configured to:
      decode a first set of reliability metrics to generate a third set of reliability metrics representing a first codeword;
      decode a second set of reliability metrics to generate a fourth set of reliability metrics representing a second codeword;
      interleave the third set of reliability metrics and the fourth set of reliability metrics to generate interleaved reliability metrics representing the interleaved codeword; and
      process the interleaved reliability metrics with a trellis detector.

18. The data storage device as recited in claim 17, wherein the controller is further configured to:
   read the interleaved codeword from the storage medium to generate a read signal;
   sample the read signal to generate signal samples;
   process the signal samples with the trellis detector to generate a sequence of reliability metrics representing the interleaved codeword; and
   de-interleave the sequence of reliability metrics into the first set of reliability metrics representing the first codeword and the second set of reliability metrics representing the second codeword.

19. The data storage device as recited in claim 17, wherein the first code rate of the first codeword increases the accuracy of the trellis detector when processing the interleaved reliability metrics.

20. The data storage device as recited in claim 17, wherein the controller is further configured to:
   decode the interleaved codeword based on at least one channel code constraint.

* * * * *